(12) United States Patent
Lee et al.

(10) Patent No.: US 8,760,885 B2
(45) Date of Patent: Jun. 24, 2014

(54) ELECTRONIC DEVICE

(75) Inventors: Chien-Yi Lee, Taipei (TW); Ching-Jen Wang, Taipei (TW); Yu-Ti Kuo, Taipei (TW); Chun-Liang Chen, Taipei (TW)

(73) Assignee: Pegatron Corporation, Taipei (TW)

( * ) Notice: Subject to any disclaimer, the term of this patent is extended or adjusted under 35 U.S.C. 154(b) by 211 days.

(21) Appl. No.: 13/349,333

(22) Filed: Jan. 12, 2012

(65) Prior Publication Data

US 2012/0182704 A1    Jul. 19, 2012

(30) Foreign Application Priority Data

Jan. 14, 2011   (TW) ............................. 100101468 A

(51) Int. Cl.
*H05K 7/14* (2006.01)
*H05K 7/18* (2006.01)
*H05K 5/00* (2006.01)
*H05K 7/00* (2006.01)

(52) U.S. Cl.
USPC ....................... 361/799; 361/752; 361/679.01

(58) Field of Classification Search
CPC .................. H01L 21/67121; H01L 21/76838; H01L 21/76877; H01L 21/76891; H01L 2223/6611; H01L 2223/6677; H01L 2223/6688; H01L 2224/16; H01L 2224/16225; H01L 2224/48145; H01L 2224/4903; H01L 2224/49113; H01L 21/4857; H01L 2223/6616; H01L 2223/6622; H01L 2224/1411; H01L 2224/14131; H01L 2224/18; H01L 2224/81192; H01L 2224/81801; H01L 2224/82039; H01L 2224/92144; H01L 23/13; H01L 23/3114; H05K 1/0233; H05K 1/0254; H05K 1/0257; H05K 1/0259; H05K 1/0263; H05K 1/0268; H05K 1/0271; H05K 1/0272; H05K 1/0284; H05K 1/029; H05K 1/0293; H05K 1/0313; H05K 1/0333; H05K 1/0346; H05K 9/0039; H05K 1/0215; H05K 9/0016; H05K 9/0067; H05K 2201/10409

USPC ............ 361/799, 796, 784, 752, 748, 679.01, 361/600; 174/51, 50, 356, 351, 350, 32
See application file for complete search history.

(56) References Cited

U.S. PATENT DOCUMENTS 3,737,156 A * 6/1973 Ward ............................. 267/154

(Continued)

FOREIGN PATENT DOCUMENTS

CN        2569533      8/2003
CN        101308163    11/2008

*Primary Examiner* — Jenny L Wagner
*Assistant Examiner* — Ahmad D Barnes
(74) *Attorney, Agent, or Firm* — J.C. Patents

(57) ABSTRACT

An electronic device including a conductive element, a conductive layer, and a case is provided. The case has a surface, a first supporting member, and a second supporting member. The first supporting member and the second supporting member are disposed on the surface, and the first supporting member has a suspending arm. The case, the first supporting member and the second supporting member are integrally formed, and the conductive layer exists on the surface of the case, the first supporting member, and the second supporting member. The conductive element presses the first suspending arm to contact the second supporting member, such that a ground circuit is formed with the conductive element, the first suspending arm, the second supporting member, and the surface.

8 Claims, 5 Drawing Sheets

(56) References Cited

U.S. PATENT DOCUMENTS

| | | | |
|---|---|---|---|
| 5,138,529 A * | 8/1992 | Colton et al. | 361/816 |
| 5,896,275 A | 4/1999 | Gaeta et al. | |
| 6,150,606 A | 11/2000 | Matsumoto et al. | |
| 6,300,579 B1 * | 10/2001 | Yumi | 174/267 |
| 6,469,912 B1 * | 10/2002 | Chuang | 361/816 |
| 6,525,266 B2 * | 2/2003 | Ferland et al. | 174/371 |
| 7,278,865 B1 * | 10/2007 | Su et al. | 439/92 |
| 2011/0122595 A1 * | 5/2011 | Shiroishi et al. | 361/818 |

* cited by examiner

ELECTRONIC DEVICE

CROSS-REFERENCE TO RELATED APPLICATION

This application claims the priority benefit of Taiwan application serial no. 100101468, filed Jan. 14, 2011. The entirety of the above-mentioned patent application is hereby incorporated by reference herein and made a part of this specification.

BACKGROUND OF THE INVENTION

1. Technical Field

The present invention relates to an electronic device and more particularly, to a case of an electronic device having a ground circuit function.

2. Description of Related Art

Along with the progress in semiconductor technology, various electronic devices are developed with functions of portability and convenience such as notebooks or portable electronic devices or the like. However, a human body carries more or less static electricity, such that the electrostatic charges are transmitted from fingers to the inside of a notebook and causes the electrostatic discharge (ESD) when the user operates the notebook. The electrostatic current formed by the electrostatic discharge is transmitted from the opening of the case (e.g., the opening of a connector) to the circuit board disposed within the notebook and damages the elements of the circuit board. Similarly, if an electric leakage occurs in the elements of the notebook, the electric current of the electric leakage may be transmitted from the opening to the outside of the case and it may cause the user to get an electric shock when the user touches the touch panel.

To solve the above problems, fabricating the case with metal is one of the resolving ways, but it may increase the weight of the notebook and does not comply with the compactness trend. In addition, a metal layer being sputtered to the internal wall of the case is another resolving way of the above problems. After the circuit board with a connector being assembled to the case, a conductive cloth or a conductive sponge is disposed and electrically bridged the connector and the metal layer of the case. Though the resolving way described above needs less and simple element, the conductive cloth or conductive sponge has to be attached manually. Thus, it has problems of positioning or tolerance, and further if a re-processing is needed, the stickiness of the detached conductive cloth or the conductive sponge may be reduced, or the metal layer of the case may be peeled off with the conductive cloth or the conductive sponge.

On the other hand, another resolving way is to dispose a metal spring between the connector and the metal layer of the case to form a ground circuit. Though it may improve the aforementioned positioning or tolerance problem of the conductive cloth or the conductive sponge, the manufacturing cost of spring is much higher than the conductive cloth or the conductive sponge.

SUMMARY OF THE INVENTION

Accordingly, the present invention provides an electronic device having a ground circuit to protect the conductive elements disposed within the electronic device.

The embodiment of the present invention provides an electronic device including a conductive element, a conductive layer and a case. The case has a surface, a first supporting member and a second supporting member. The first supporting member and the second supporting member are integrally formed on the surface of the case and the first supporting member has a first suspending arm. The conductive layer exists on the surface of the case, the first supporting member and the second supporting member. The conductive element is adapted to press the first suspending arm so that the first suspending arm contacts with the second supporting member and the conductive element, the surface of the case, of the first supporting member and the second supporting member are connected to form a ground circuit.

According to an embodiment of the present invention, a material of the case, the first supporting member and the second supporting member is plastic.

According to an embodiment of the present invention, the electronic device further includes a circuit board, wherein the conductive element is disposed on the circuit board, after the electronic device is assembled, the conductive element presses the first suspending arm.

According to an embodiment of the present invention, the first supporting member has a body, a first end and a second end. The body is formed on the surface of the case. The first end is connected with the body. The second end is connected with the first end and extends to the second supporting member. When the conductive element presses the first suspending arm, the first suspending arm moves toward the second supporting member by using the body as a pivot so that the second end contacts with the second supporting member.

According to an embodiment of the present invention, a gap exists between the second supporting member and the second end of the first suspending arm.

According to an embodiment of the present invention, the electronic device further includes a rib formed on the surface of the case and adjacent to the body.

According to an embodiment of the present invention, the first supporting member has a second suspending arm. The first suspending arm and the second suspending arm are respectively disposed at each side of the body, and extending directions of the first suspending arm and second suspending arm are opposite.

According to an embodiment of the present invention, the second supporting member has a first portion and a second portion, and the first portion and the second portion are parted from each other and respectively corresponding to the first suspending arm and the second suspending arm.

According to an embodiment of the present invention, the first suspending arm has a first arm and a second arm, wherein the first arm is connected between the body and the second arm, and a first included angle is formed between the first arm and the body, and a second included angle is formed between the first arm and the second arm.

According to an embodiment of the present invention, the first suspending arm has a compression value, and the compression value=$A \times \tan \theta$, wherein A is a normal projection length of the first arm projected on the surface, $\theta$ is an included angle between the first arm and the surface.

In light of the above, in the embodiment of the present invention, through the integrally formed first supporting member and second supporting member, the conductive element can be supported on the first supporting member when it is disposed at the case. And the conductive element is electrically connected to the conductive layer disposed on the surface of the case through the conductive layer of the first supporting member. This makes the case to form a ground circuit effect to the conductive element. Moreover, after the conductive element presses the first suspending arm, the first suspending arm can move to prop against the second supporting member due to the flexibility of the first supporting member. This makes the second supporting member disposed on the surface of the case act as a supporting structure of the first supporting member and the conductive element. The structure is not only strengthened to increase the durability, the case is also adapted to different sizes of conductive elements to increase the applicability.

Several exemplary embodiments accompanied with figures are described in detail below to further describe the disclosure in detail.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
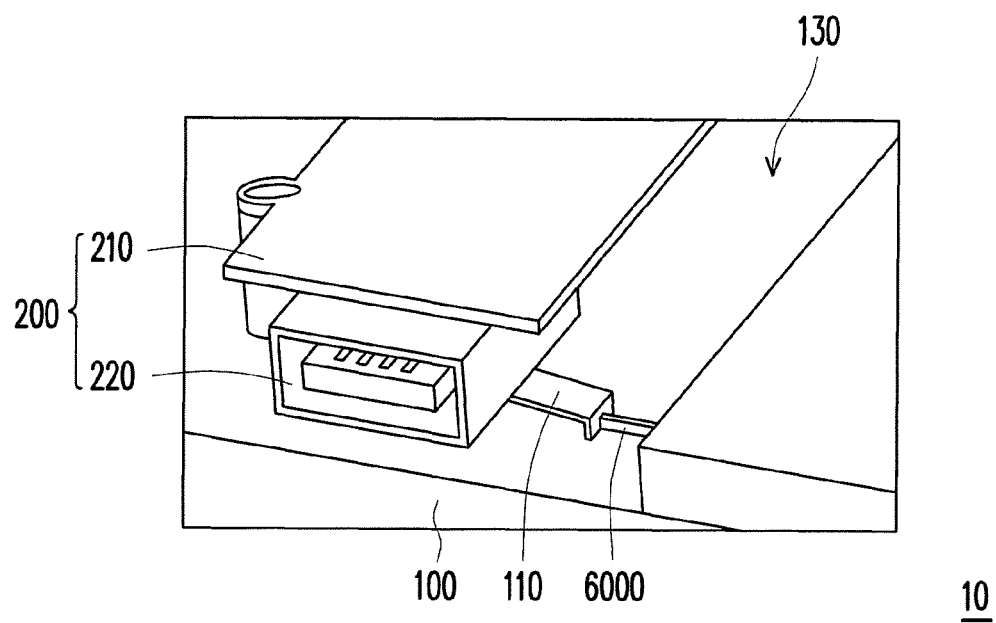
FIG. 1A is a partial schematic view illustrating an electronic device according to an embodiment of the present invention.
Figure 1B:
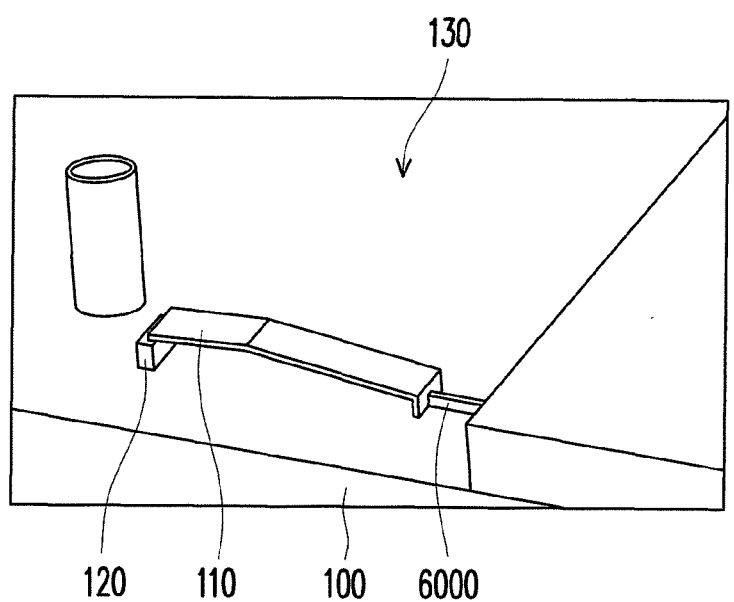
FIG. 1B is the electronic device of FIG. 1A without the conductive element.
Figure 2A:
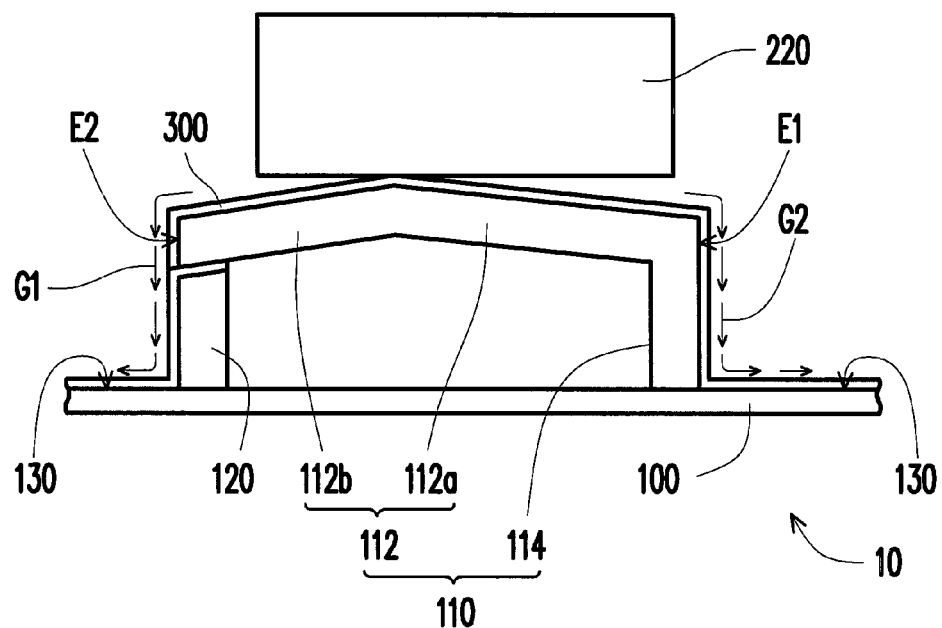
FIG. 2A and FIG. 2B are partial side views of the electronic device in FIG. 1A and FIG. 1B, respectively.
Figure 2B:
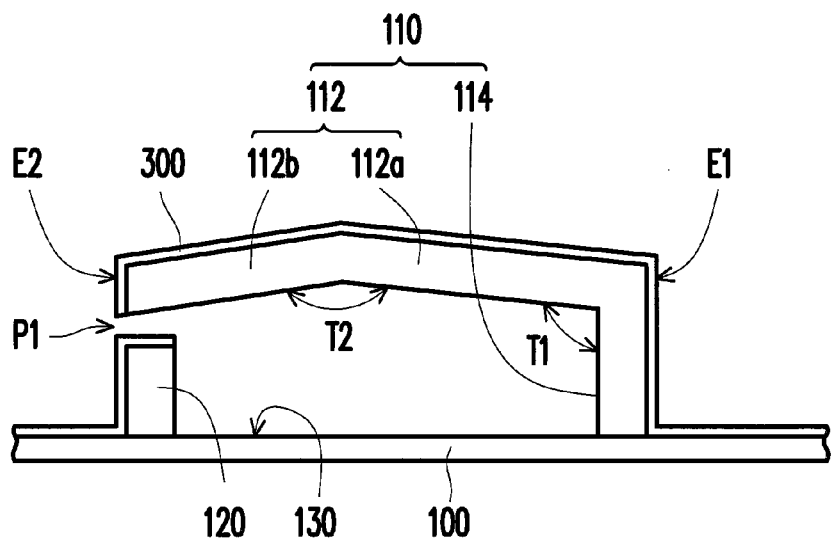

FIG. 1A is a partial schematic view illustrating an electronic device according to an embodiment of the present invention. FIG. 1B is the electronic device of FIG. 1A without the conductive element. FIG. 2A and FIG. 2B are partial side views of the electronic device in FIG. 1A and FIG. 1B, respectively. Referring to FIG. 1A, FIG. 1B, FIG. 2A and FIG. 2B, in the present embodiment, an electronic device 10 includes a case 100, a conductive element 220, a circuit board 210 and a conductive layer 300, wherein the conductive element 220 is disposed on the circuit board 210. In the present embodiment, the electronic device 10 can be a notebook or a tablet personal computer. In the embodiment, the conductive element 220 can be a connector, an electronic part, a printed circuit board or an element having conductive properties. In the following description, the conductive element 220 acting as the universal serial bus (USB) connector is exemplified and illustrated, which should however not be construed as a limitation of the present invention. In the embodiment, the combination of the conductive element 220 and the circuit board 210 can be named as a module 200.

In this embodiment, the case 100 has a first supporting member 110, a second supporting member 120 and a surface 130. The first supporting member 110 and the second supporting member 120 are integrally formed on the surface 130 of the case 100 and the first supporting member 110 has a first suspending arm 112. The conductive layer 300 exists on the surface 130 of the case 100, the first supporting member and the second supporting member 120.

After the electronic device 10 is assembled, the conductive element 220 disposed at a side of the circuit board 210 presses the first suspending arm 112 so that the first suspending arm 112 contacts with the second supporting member 120 and the conductive element 220, the first supporting member 110, the second supporting member 120 and the surface 130 of the case 100 are connected to form a ground circuit G1, G2, so that the electronic device 10 can comply with the standard of electrostatic discharge protection after assembled. In the embodiment, the case 100, the first supporting member 110 and the second supporting member 120 is fabricated by an injection molding process, and after the injection molding process the internal wall of the case 100 is sputtered with metal to be conductive. However, the present invention is not limited thereto.

In the embodiment, during the assembling process of the electronic device 10, when the circuit board 210 is assembled into the case 100, the conductive element 220 of the module 200 substantially props against or presses on the first suspending arm 112. At this moment, the electrostatic current of the conductive element 220 may be transmitted through the conductive layer 300 formed on the first supporting member 110 and the conductive layer 300 formed on the surface 130 of the case 100, so as to form a ground circuit G2 among the conductive element 220, the first supporting member 110 and the surface 130 of the case 100.

Then, when the conductive element 220 exerts a greater compression force on the first suspending arm 112 due to the assembling process or the size, the conductive element 220 may press the first suspending arm 112 so that the first suspending arm 112 moves toward the second supporting member 120 and contacts and props against with the second supporting member 120 to form the ground circuit G1 and G2. Moreover, the first suspending arm 112 can disperse the force exerted on the first suspending arm 112 by the conductive element 220 through the second supporting member 120.

More specifically, the first supporting member 110 includes a body 114, a first end E1 and a second end E2. The body 114 is formed on the surface 130 of the case 100. The first end E1 is connected with the body 114. The second end E2 is connected with the first end E1 and extends to the second supporting member 120.

When the conductive element 220 presses the first suspending arm 112, the first suspending arm 112 moves toward the second supporting member 120 by using the body 114 as a pivot so that the second end E2 of the first supporting member 110 contacts with the second supporting member 120. Accordingly, when the conductive element 220 props against the first supporting member 110, the first supporting member 110 can effectively distribute the force exerted on the first supporting member 110 by the conductive element 220 through the second supporting member 120, so that the first suspending arm 112 has a better supporting strength.

Thus, through the first supporting member 110 and the second supporting member 120 integrally formed on the surface 120 of the case 100, and the first supporting member 110 having the first suspending arm 112 to props against the conductive element 220, regardless of the size of the conductive element 220 or the configuration of the conductive element 220 on the case 100 being different with the specification of the conductive element 220, compared to the metal spring in the prior, the case 100 can have both the ability of supporting flexibility of the metal spring and the applicability which is lacked in the metal spring due to the size restriction because of the flexibility of the first suspending arm 112. In addition, since the second supporting member 120 can also be the supporting structure of the first supporting member 110, the case 100 of the embodiment further has a better supporting strength and durability.

Referring to FIG. 2A and FIG. 2B, in the present embodiment, the first suspending arm 112 has a first arm 112a and a second arm 112b. The first arm 112a is connected between the body 114 and the second arm 112b, and a first included angle T1 is formed between the first arm 112a and the body 114, and a second included angle T2 is formed between the first arm 112a and the second arm 112b. It has to be noted that the first included angle T1 is used to adjust the compression capability of the first suspending arm 112 when supporting the conductive element 220. And the second included angle T2 is used to adjust the contact area between the conductive element 220 and the first suspending arm 112, wherein a gap P1 existing between the second end E2 of the first suspending arm 112 and the second supporting member 120 can be changed by adjusting the first included angle T1.

For example, when the normal projection length of the first arm 112a of the first suspending arm 112 on the surface 130 is A, the first suspending arm 112 has a compression value C, and the compression value C can be represented as:

$C = A \times \tan \theta$, wherein $\theta$ is the included angle between the first arm 112a and the surface 130. Therefore, the length of the first suspending arm 112 and the first included angle T1 between the first suspending arm 112 and the body 114 can be adjusted as required to change the size of the gap P1, so that the first supporting member 110 can support the load of the conductive element 220.

Figure 3A:
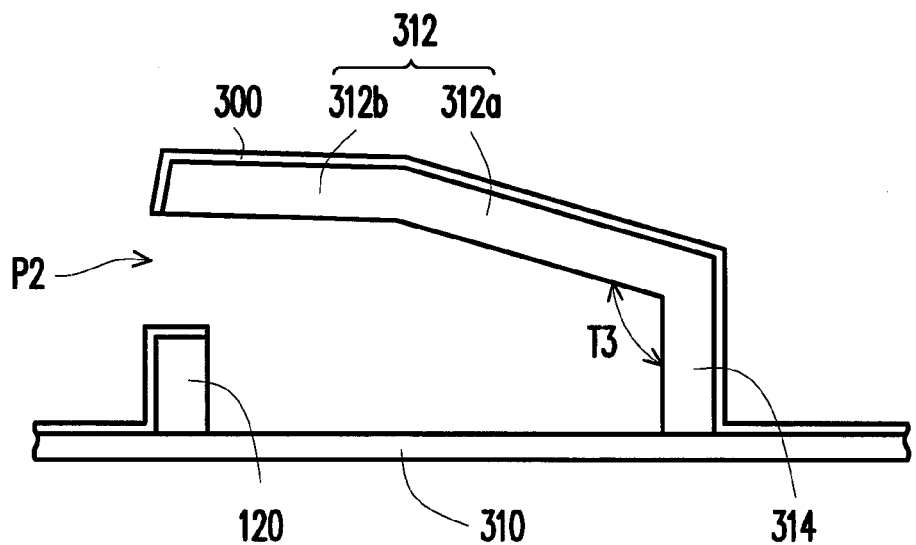
FIG. 3A is a partial side view illustrating an electronic device according to an embodiment of the present invention.

FIG. 3A is a partial side view illustrating an electronic device according to an embodiment of the present invention. Referring FIG. 3A, FIG. 2A and FIG. 2B, the difference between the aforementioned embodiment and the present embodiment is that the first included angle T3 formed between the first arm 312a on the case and the body 314 is greater than the first included angle T1 of the aforementioned embodiment. This increases the gap P2 between the second arm 312b and the second supporting member 120. Thus, the first suspending arm 312 can increase the flexibility of the supported conductive element 220 (shown in FIG. 2B) with the compression of the gap P2, or the first suspending arm 312 can clip a very thin connector (not shown).

Figure 3B:
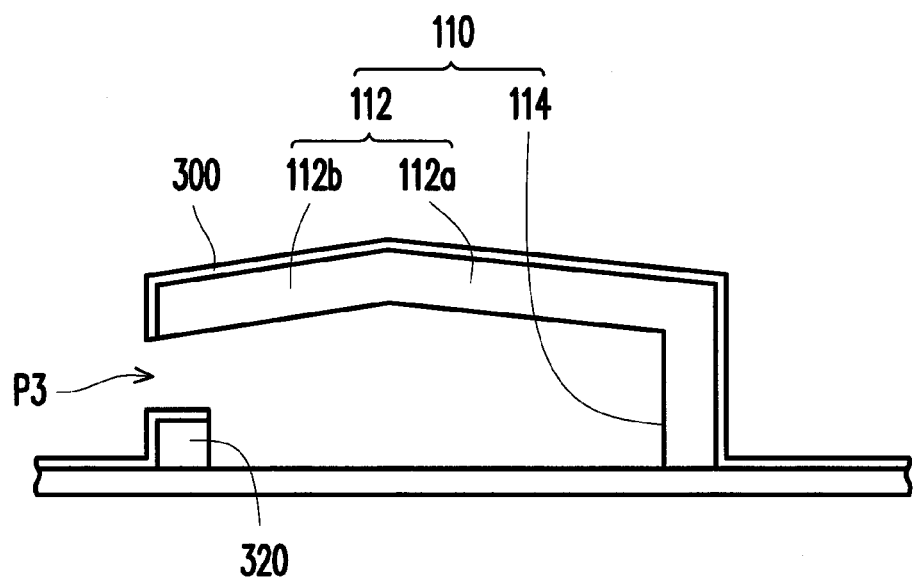
FIG. 3B is a partial side view illustrating an electronic device according to an embodiment of the present invention.

FIG. 3B is a partial side view illustrating an electronic device according to an embodiment of the present invention. Referring to FIG. 3B, the gap P3 between the first supporting member 110 and the second supporting member 320 can be adjusted to correspondingly adjust the compression capability of the first suspending arm 112 by changing the height of the second supporting member 320.

Figure 4:
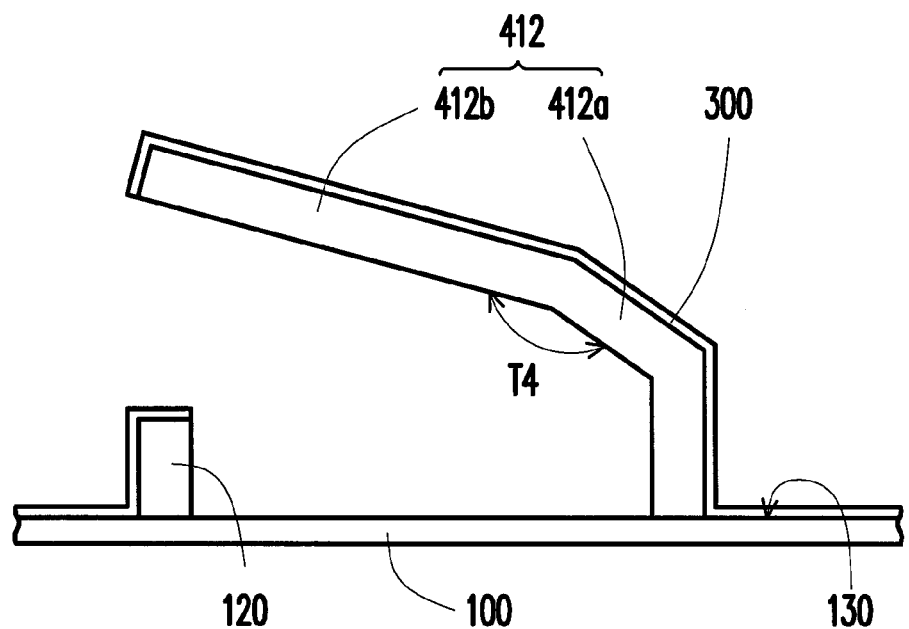
FIG. 4 is a partial side view illustrating an electronic device according to another embodiment of the present invention.

On the other hand, FIG. 4 is a partial side view illustrating an electronic device according to another embodiment of the present invention. Referring to FIG. 4, when the conductive element 220 (shown in FIG. 2B) presses the first suspending arm 412 by adjusting the second included angle T4, the second arm 412b and the conductive element 220 are on the same plane. And accordingly, the conductive element 220 can have a larger contact area when propping against the second arm 412b, so as to increase the ground circuit effect between the conductive layer 300 of the conductive element 220 and the first suspending arm 412 and the surface 130 of the case 100. Further in another embodiment, the second included angle T4 can be almost 180°, so that the first arm 412a and the second arm 412b are coplanar, and it further increases the contact area between the conductive element 220 and the first suspending arm 412.

Figure 5:
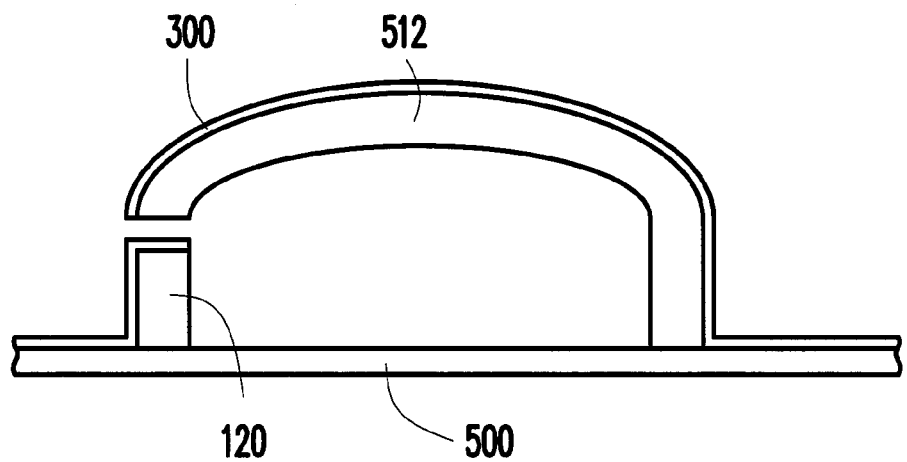
FIG. 5 is a partial side view illustrating an electronic device according to another embodiment of the present invention.

FIG. 5 is a partial side view illustrating an electronic device according to another embodiment of the present invention. Referring to FIG. 5, the difference between the aforementioned embodiment and the present embodiment is that the first suspending arm 512 formed on the case 500 is in an arc-shaped structure. Similar to the embodiment of FIG. 4, a larger contact area between the first suspending arm 512 and the conductive element 200 (shown in FIG. 2B) and a better ground circuit effect can be obtained.

Therefore, all the methods of adjusting the size or the included angle of the first supporting member or the second supporting member to correspondingly support the connector can be applied in the present invention.

Figure 6:
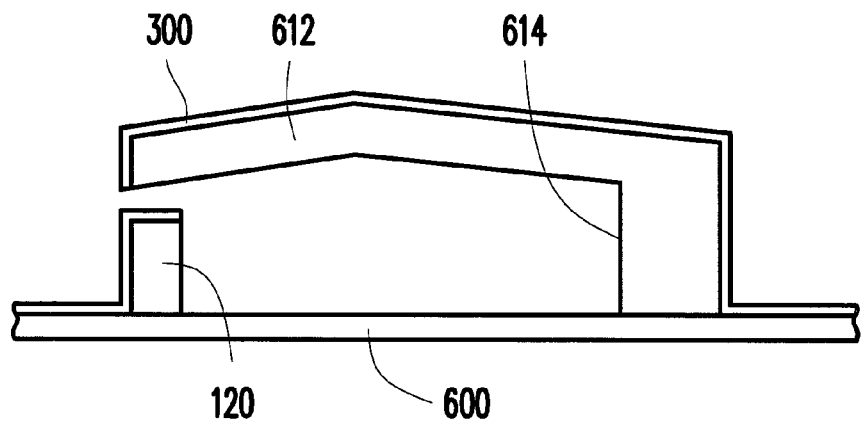
FIG. 6 is a partial side view illustrating an electronic device according to another embodiment of the present invention.

Referring to FIG. 1A and FIG. 1B, in the embodiment, the electronic device 10 further includes a rib 6000 formed on the surface 130 of the case 100 and adjacent to the body 114 of the first supporting member 110. This make the body 114 to have a better structural strength to support loading when the conductive element 220 props against the first suspending arm 112. However, the present invention is not limited thereto. FIG. 6 is a partial side view illustrating an electronic device according to another embodiment of the present invention. Referring FIG. 6, FIG. 2A and FIG. 2B, the difference between the aforementioned embodiment and the present embodiment is that the connecting area formed between the body 614 and the case 600 is greater than the connecting area between the body 114 and the case 100 of the aforementioned embodiment. In other words, the connecting area between the body 614 and the case 600 (i.e., the size of the body 614) can be adjusted according to the specification of the conductive element 220 (shown in FIG. 2A) or the loading which the first suspending arm 612 can support, so as to obtain a better load supporting capability.

Figure 7:
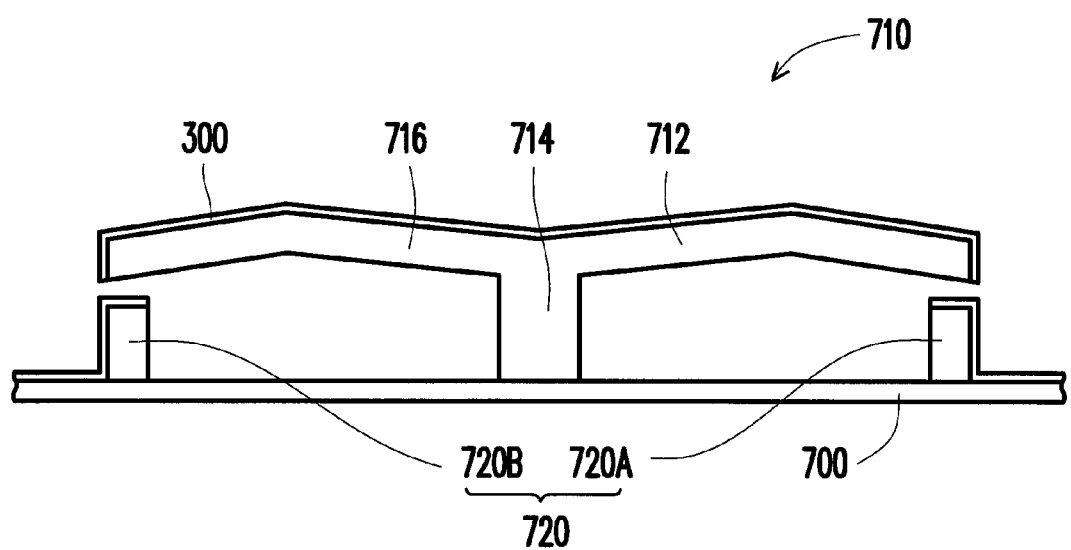
FIG. 7 is a partial side view illustrating an electronic device according to another embodiment of the present invention.

FIG. 7 is a partial side view illustrating an electronic device according to another embodiment of the present invention. Referring to FIG. 7A, in the embodiment, the first supporting member 710 formed on the case 700 has a first suspending arm 712 and a second suspending arm 716. The first suspending arm 712 and the second suspending arm 716 are respectively disposed at each side of the body 714, and the first suspending arm 712 and second suspending arm 716 extend from the same side of the body 714 toward opposite directions. Furthermore, the second supporting member 720 includes a first portion 720A and a second portion 720B parted from each other. The first portion 720A is corresponding to the first suspending arm 712 and the second portion 720B is corresponding to the second suspending arm 716. In other words, the case 700 of the embodiment is adapted to support an electronic device having two connectors (not shown). However, it is only one of the representative embodiments and it can be properly changed according to the shape of the electronic device or the number of connectors.

In light of the foregoing, in the embodiment of the present invention, through the integrally formed first supporting member and second supporting member, the conductive element can be supported on the first supporting member when it is disposed at the case. And the conductive element is electrically connected to the conductive layer disposed on the surface of the case through the conductive layer of the first supporting member. This makes the case to form a ground circuit effect to the conductive element.

Moreover, after the conductive element presses the first suspending arm, the first suspending arm can move to prop against the second supporting member due to the flexibility of the first supporting member. This makes the second supporting member disposed on the surface of the case act as a supporting structure of the first supporting member and the conductive element. The structure is not only strengthened to increase the durability, the case is also adapted to different sizes of conductive elements to increase the applicability.

Furthermore, the sizes of the first supporting member and the second supporting member can be change to be adapted to various connectors, so that the case can support various electronic devices or can be in various configurations to improve the applicability.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electronic device, comprising:
   a conductive element;
   a case having a surface, a first supporting member and a second supporting member, the first supporting member and the second supporting member integrally formed on the surface of the case, the first supporting member having a first suspending arm; and
   a conductive layer existing on the surface of the case, the first supporting member and the second supporting member,
   wherein the conductive element is adapted to press the first suspending arm so that the first suspending arm contacts with the second supporting member and the conductive element, the surface of the case, the first supporting member and the second supporting member are connected to form a ground circuit,
   wherein the first supporting member has a body, a first end and a second end, wherein the body is disposed on the surface of the case, the first end is connected with the body, the second end is connected with the first end and extends to the second supporting member, when the conductive element presses the first suspending arm, the first suspending arm moves toward the second supporting member by using the body as a pivot so that the second end contacts with the second supporting member.

2. The electronic device as claimed in claim 1, further comprising a circuit board, wherein the conductive element is disposed on the circuit board, after the electronic device is assembled, the conductive element presses the first suspending arm.

3. The electronic device as claimed in claim 1, wherein a gap exists between the second supporting member and the second end of the first suspending arm.

4. The electronic device as claimed in claim 3, wherein the first suspending arm has a first arm and a second arm, the first arm is connected between the body and the second arm, and a first included angle is formed between the first arm and the body, and a second included angle is formed between the first arm and the second arm.

5. The electronic device as claimed in claim 4, wherein the first suspending arm has a compression value, and
   compression value=$A \times \tan \theta$
   wherein A is a normal projection length of the first arm projected on the surface, $\theta$ is an included angle between the first arm and the surface.

6. The electronic device as claimed in claim 1, further comprising:
   a rib formed on the surface of the case and adjacent to the body.

7. The electronic device as claimed in claim 1, wherein the first supporting member has a second suspending arm, the first suspending arm and the second suspending arm are respectively disposed on each side of the body, and extending directions of the first suspending arm and the second suspending arm are opposite.

8. The electronic device as claimed in claim 7, wherein the second supporting member has a first portion and a second portion, and the first portion and the second portion are parted from each other and respectively corresponding to the first suspending arm and the second suspending arm.

* * * * *